(12) United States Patent
Cox et al.

(10) Patent No.: US 9,258,911 B2
(45) Date of Patent: Feb. 9, 2016

(54) MULTI-RACK RETRACTABLE DOOR APPARATUS

(71) Applicant: International Business Machines Corporation, Armonk, NY (US)

(72) Inventors: Aaron R. Cox, Tucson, AZ (US); Jason E. Minyard, Phoenix, AZ (US); Camillo Sassano, Durham, NC (US); Kevin L. Schultz, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 14/226,973

(22) Filed: Mar. 27, 2014

(65) Prior Publication Data

US 2015/0282342 A1    Oct. 1, 2015

(51) Int. Cl.
| | |
|---|---|
| H05K 5/02 | (2006.01) |
| E06B 9/17 | (2006.01) |
| E06B 9/171 | (2006.01) |
| E06B 9/11 | (2006.01) |
| A47B 81/00 | (2006.01) |
| A47B 96/00 | (2006.01) |
| H05K 5/03 | (2006.01) |

(52) U.S. Cl.
CPC ........ *H05K 5/02* (2013.01); *A47B 81/00* (2013.01); *A47B 96/00* (2013.01); *E06B 9/115* (2013.01); *E06B 9/17* (2013.01); *E06B 9/171* (2013.01); *H05K 5/03* (2013.01)

(58) Field of Classification Search
CPC .......... A47B 81/00; A47B 96/00; H05K 5/03; E06B 9/08; E06B 9/115; E06B 9/11; E06B 9/17; E06B 9/171

USPC ................................................... 312/199, 297
See application file for complete search history.

(56) References Cited

U.S. PATENT DOCUMENTS

| | | | | |
|---|---|---|---|---|
| 4,235,494 A * | 11/1980 | Chu et al. | ...... | 312/297 |
| 4,279,454 A * | 7/1981 | Koiso et al. | ...... | 312/297 |
| 5,636,679 A * | 6/1997 | Miller et al. | ...... | 160/317 |
| 6,629,555 B2 | 10/2003 | DeBlock et al. | | |
| 8,528,623 B2 * | 9/2013 | Roberts | ...... | 160/267.1 |
| 8,936,329 B2 * | 1/2015 | Kuo | ...... | 312/297 |
| 2002/0092628 A1 * | 7/2002 | Todd | ...... | 160/309 |
| 2003/0221797 A1 * | 12/2003 | Schaller, Jr. | ...... | 160/133 |

(Continued)

FOREIGN PATENT DOCUMENTS

| | | |
|---|---|---|
| EP | 0086023 A1 | 8/1983 |
| WO | 9112404 | 8/1991 |

*Primary Examiner* — Daniel Rohrhoff
(74) *Attorney, Agent, or Firm* — Penny L. Lowry; Jennifer M. Anda (57) ABSTRACT

A electronic equipment rack assembly retractable door apparatus is disclosed, which may include channels, horizontally mounted at the top and bottom of an open side of the rack assembly, and latch plates mounted to the rack assembly. The retractable door apparatus may have movable door frame members, each having a housing with a cavity and a slot opening to the cavity, rollers attached to the housing and contained within the channels, designed to maintain the door frame member in a vertical orientation, a spool, attached within the housing, a spring configured provide a torsional tensioning force on the spool, and a latching door handle, attached to the housing to engage with the latch plate receptacles. The retractable door apparatus may also include a door material attached to the door frame member spools and configured to pass through the slots in the door frame member housings.

19 Claims, 10 Drawing Sheets

(56) References Cited

U.S. PATENT DOCUMENTS

| | | | |
|---|---|---|---|
| 2004/0031574 A1* | 2/2004 | Gambarelli et al. | 160/122 |
| 2004/0113528 A1* | 6/2004 | Wang | 312/3 |
| 2004/0136165 A1* | 7/2004 | Wang | 361/727 |
| 2007/0193705 A1* | 8/2007 | Hsu | 160/238 |
| 2007/0284051 A1* | 12/2007 | Grimes et al. | 160/23.1 |
| 2008/0121352 A1* | 5/2008 | Cheng | 160/238 |
| 2009/0008042 A1* | 1/2009 | Snyder et al. | 160/264 |
| 2011/0108207 A1* | 5/2011 | Mainers et al. | 160/87 |

\* cited by examiner

MULTI-RACK RETRACTABLE DOOR APPARATUS

TECHNICAL FIELD

The present disclosure relates to electronic equipment racks. In particular, this disclosure relates to multi-rack retractable doors which may be used to provide a slidable closure mechanism for open sides of adjacent electronic equipment racks.

BACKGROUND

Electronic equipment enclosures (racks) may be used to contain servers, computer systems, telecommunications equipment and other information technology (IT) devices that may be used by businesses. Electronic equipment racks may be arranged adjacently in rows within a data center or central office location, in order to make efficient use of floor space, and to facilitate power and signal interconnection (cabling) between equipment within the racks.

Electronic equipment racks may be designed according to information technology (IT) industry standards, and may have standard heights, widths, and cavity dimensions for equipment they may house. For example, a rack unit (U or RU) may be a unit of measure that describes the height of equipment designed to mount in a particular type of rack. One rack unit may be 1.75 inches high. A 19-inch or 23-inch rack dimension may refer to the width of the equipment mounting frame in the rack, including the frame. The width of the equipment that can be mounted inside the rack may be less than the specified (e.g., 19 inch) dimension.

Electronic equipment racks may be designed and outfitted with a variety of features to accommodate the equipment mounted within them, and to facilitate power and signal interconnections to the equipment. For example, equipment racks may contain cooling fans or other cooling apparatus to provide airflow around/through the equipment, and intake and exhaust vents to allow cooling air to enter and exit the rack. Equipment racks may also contain power distribution wiring, removable power supply units, cable retention/management hardware, and wheels or casters which may allow them to be easily moved.

SUMMARY

Various aspects of the present disclosure may be useful for integrating a retractable door assembly into an electronic equipment enclosure. A retractable door assembly configured according to embodiments of the present disclosure may eliminate data center aisle obstructions during maintenance and configuration operations involving electronic equipment racks.

Embodiments may be directed towards a retractable door apparatus for an electronic equipment rack assembly. The retractable door apparatus may include a first structure, having a first channel, which is horizontally mounted at the top of an open side of the rack assembly, and a second structure, having a second channel, that is horizontally mounted at the bottom of the open side of the rack assembly. The retractable door apparatus may also include a first and a second latch plate, each having a receptacle and mounted to the electronic equipment rack assembly, and a first and a second horizontally movable door frame member. The first and a second horizontally movable door frame members may each have a housing with an interior cavity and a slot defining an opening to the interior cavity, and a first roller, rotationally attached to an upper location of the housing, contained within the first channel and designed to maintain the door frame member in a vertical orientation. The first and a second horizontally movable door frame members may each also have a second roller, rotationally attached to a lower location of the housing, contained within the second channel and designed to maintain the door frame member in a vertical orientation. The horizontally movable door frame members may also have a spool, rotationally attached to the housing and positioned within the interior cavity of the housing, a spring operably coupled to the spool and to the housing to provide a torsional tensioning force on the spool, and a latching door handle, slidably attached to the housing to engage, in a latched position, with the receptacle of one of the first latch plate and the second latch plate. The retractable door apparatus may also include a door material having a first lateral side attached to the spool of a first door frame member and a second lateral side attached to the spool of a second door frame member, and configured to pass through the slots in the housings of the first and of the second door frame members.

Embodiments may also be directed towards an electronic equipment rack assembly. The electronic equipment rack assembly may include a plurality of electronic equipment enclosures, arranged adjacently. Each electronic equipment enclosure may include a first side surface and a second side surface opposite to the first side surface, the first and second side surfaces defining a cavity for housing an electronic component, and a first mounting rail adjacent to the first side surface, and a second mounting rail adjacent to the second side surface, the first and second mounting rails configured to support the electronic component. The electronic equipment enclosure may also include an open side, facing a first direction, and a first retractable door apparatus. The first retractable door apparatus may include a first channel that is horizontally mounted at the top of an open side of the rack assembly, a second channel that is horizontally mounted at the bottom of the open side of the rack assembly, a first and a second latch plate, each having a receptacle, and mounted to the rack assembly, and a first and a second horizontally movable door frame member. The first and a second horizontally movable door frame member may each have a housing with an interior cavity and a slot defining an opening to the interior cavity, a first roller, rotationally attached to an upper location of the housing, contained within the first channel and designed to maintain the door frame member in a vertical orientation. The first and a second horizontally movable door frame member may also each have a second roller, rotationally attached to a lower location of the housing, contained within the second channel and designed to maintain the door frame member in a vertical orientation, a spool, rotationally attached to the housing and positioned within the interior cavity of the housing, a spring operably coupled to the spool and to the housing to provide a torsional tensioning force on the spool, and a latching door handle, slidably attached to the housing to engage, in a latched position, with the receptacle of one of the first latch plate and the second latch plate. The first retractable door apparatus may also include a door material having a first lateral side attached to the spool of a first door frame member and a second lateral side attached to the spool of a second door frame member, and configured to pass through the slots in the housings of the first and of the second door frame members.

Embodiments may also be directed towards a retractable door apparatus kit for an electronic equipment rack assembly. The retractable door apparatus kit may include a first channel configured to be horizontally mounted at the top of an open side of the rack assembly, a second channel configured to be horizontally mounted at the bottom of the open side of the rack assembly, a first and a second latch plate, each having a receptacle, and configured to be mounted to the rack assembly, and a first and a second horizontally movable door frame member. The first and a second horizontally movable door frame members may each have a housing with an interior cavity and a slot defining an opening to the interior cavity, a first roller, configured to be rotationally attached to an upper location of the housing and contained within the first channel and designed to maintain the door frame member in a vertical orientation, and a second roller, configured to be rotationally attached to a lower location of the housing and contained within the second channel, and designed to maintain the door frame member in a vertical orientation. The first and a second horizontally movable door frame members may also each have a spool, configured to be rotationally attached to the housing and positioned within the interior cavity of the housing, a spring configured to be operably coupled to the spool and to the housing to provide a torsional tensioning force on the spool, and a latching door handle, configured to be slidably attached to the housing to engage, in a latched position, with the receptacle of one of the first latch plate and the second latch plate. The retractable door apparatus kit may also have a door material having a first lateral side configured to be attached to the spool of a first door frame member and a second lateral side configured to be attached to the spool of a second door frame member, and configured to pass through the slots in the housings of the first and of the second door frame members.

Aspects of the various embodiments may be used to eliminate a need to remove electronic equipment rack doors to gain access to electronic devices within an electronic equipment rack. Aspects of the various embodiments may also be useful for providing cost-effective retractable doors for use with electronic equipment enclosures, by using existing and proven mechanical design practices, and machining and fabrication technologies. The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention. In the drawings and the Detailed Description, like numbers generally refer to like components, parts, steps, and processes

DETAILED DESCRIPTION

Certain embodiments of the present disclosure can be appreciated in the context of providing a retractable door assembly for electronic equipment enclosures for electronic devices such as servers, storage devices or network switches, which may be used to provide data to clients attached to a server through a network. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing a retractable door assembly for electronic equipment enclosures housing devices such as computing systems, which may be used in a wide variety of computational and data processing applications. Such computing systems may include, but are not limited to, supercomputers, high-performance computing (HPC) systems, and other types of special-purpose computers. Embodiments may also be directed towards providing a retractable door assembly for electronic equipment for electronic devices including laboratory equipment, audio devices/systems, and other types of rack-mounted devices.

Various embodiments of the present disclosure relate to a retractable door apparatus configured to be attached to an exterior face of an electronic equipment rack assembly. The retractable door apparatus may be useful for providing rapid and convenient access to the contents of multiple adjacent equipment racks. Reduced rack-mounted system configuration and maintenance time may result from the use of a retractable door apparatus. The retractable door apparatus may eliminate the need to remove rack doors while allowing access to equipment and cabling within the rack assembly, and not restricting airflow through the rack assembly.

A retractable door apparatus designed according to certain embodiments may be compatible with existing and proven electronic equipment enclosures and equipment rack assemblies, and may be a useful and cost-effective way to provide a closure apparatus for rack assemblies. A retractable door apparatus constructed according to embodiments of the present disclosure may be installed on an existing electronic equipment rack assembly, and may be opened or closed from left or a right side of the rack assembly, which may allow a single rack, adjacent set of racks, or all of the racks of the rack assembly to be closed.

Electronic equipment such as computing systems, servers, network switches and telecommunications devices may be housed in electronic equipment enclosures, also known as racks or cabinets, which may be installed in data centers. Multiple racks may be arranged adjacent to each other, in rows or rack assemblies, and the rows may be separated by aisles within a data center or central office location. In order to make efficient use of data center floor space, equipment cooling systems, and cabling between racks, the aisles between racks may be narrow.

Racks and rack assemblies may be equipped with front and rear doors, which may be hinged, allowing them to swing outwards from the racks, which may allow service personnel to access the devices and cabling within the racks/rack assemblies. Efficient configuration and maintenance operations on equipment housed within racks may involve moving components (e.g., a server, processor unit or network switch) from one rack to another, or installing/configuring cabling between racks. Such operations may be performed efficiently with one or more rack doors open simultaneously, which may create aisle obstructions and safety hazards. Minimal aisle widths and particular rack locations may also require individual rack doors to be opened and closed sequentially, which may be cumbersome while performing certain maintenance operations. For example, while working between adjacent racks, a service technician may need to repeatedly open a door to a rack, and close the door of a rack next to it, in order to perform a task such as moving an electronic component or configuring cabling between the racks.

Rack doors may be removed from racks before performing maintenance operations to avoid having to open and shut them repeatedly, and/or having them obstruct access to aisles or the contents of the racks. Considerable effort may be required to remove the rack doors, and storing the doors a convenient location may be difficult. Doors may also be damaged (i.e., fall over, or against each other) during moving or storage.

Figure 1:
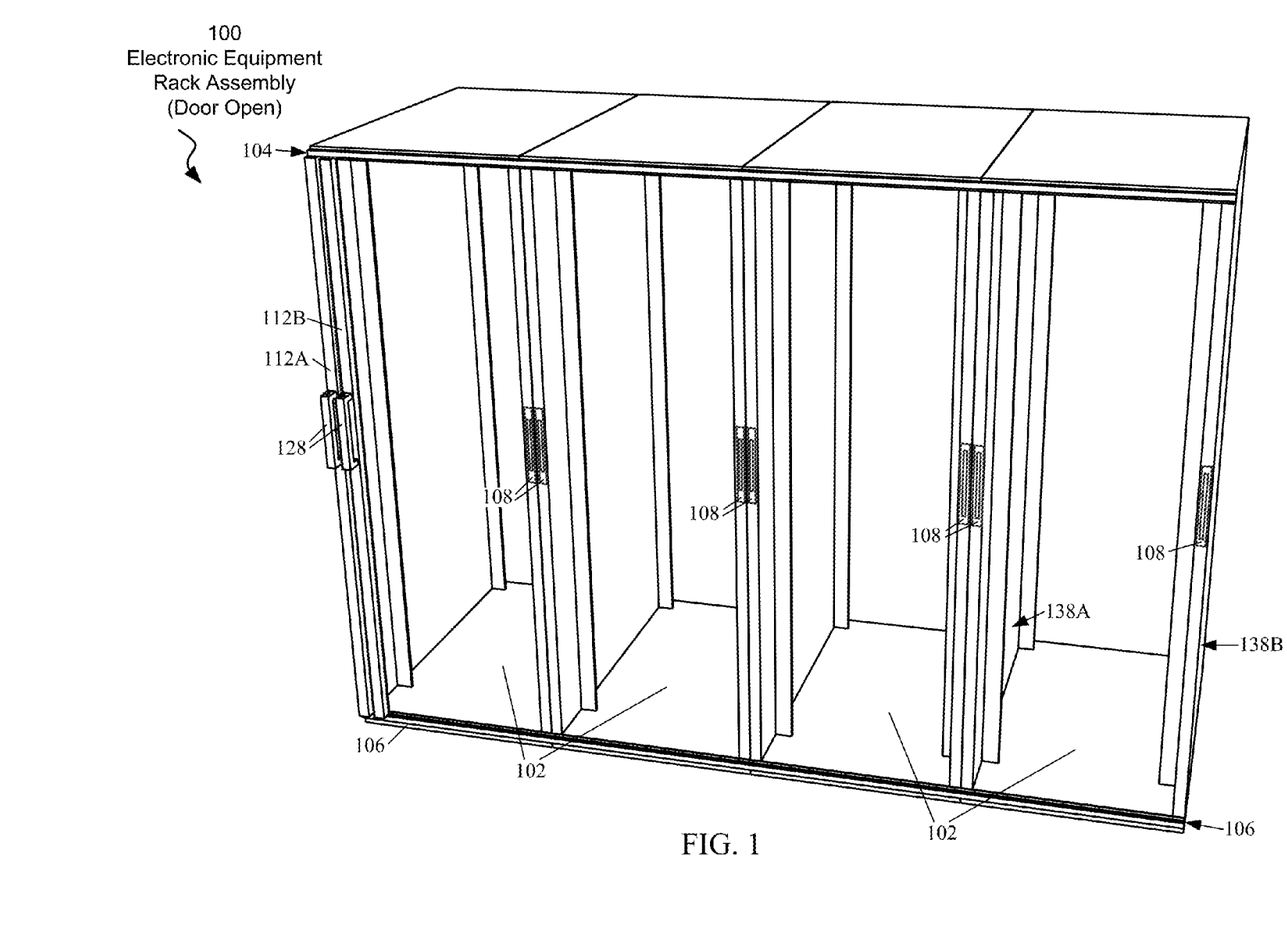
FIG. 1 is an isometric drawing of an electronic equipment rack assembly, including a retractable door apparatus, according to embodiments of the present disclosure.

Certain embodiments relate to the use of a retractable door apparatus, for an electronic equipment rack assembly, which may not obstruct access to the contents of the rack assembly, or to service aisles between adjacent rack assemblies. FIG. 1 is an isometric drawing of an electronic equipment rack assembly 100, including a retractable door apparatus, in an open position, generally useful for covering one or more adjacent open sides of the racks 102 of the equipment rack assembly 100, according to embodiments of the present disclosure. The retractable door apparatus may include (first and second) horizontally movable door frame members 112A, 112B, respectively, and (first and second) horizontally mounted structures 104, 106, such as metal bars, that have channels formed within them. For simplicity, the structures and their channels are collectively referred to herein simply as "channels." The retractable door apparatus may also include, respectively, latching door handles 128, and latch plates 108, according to embodiments.

In embodiments, the electronic equipment rack assembly 100 may include a plurality of electronic equipment enclosures (racks or partitions) 102 which may be arranged adjacent to each other; the arrangement may be useful in making efficient use of data center floor space. Open sides of racks 102 included in electronic equipment rack assembly 100 may face a common direction. Adjacent racks 102 may be aligned and/or attached to each other through the use of alignment features including but not limited to holes in standardized positions, and fasteners such as bolts, nuts and screws.

Each rack 102 may include a cavity for housing electronic components, defined by a first side surface 138A and a second side surface 138B, opposite to the first side surface. Top, bottom, front and back sides of a rack 102 may also define the cavity. Each cavity may have a (first and second) mounting rail adjacent to the (first and second) side surfaces 138A, 138B, where the (first and second) mounting rails are configured to support electronic components within the cavity.

Racks 102 may have industry-standard dimensions, for example, 19 inch or 23 inch wide openings for electronic components, and 42U or 47U standard heights, and may be used to house components including server, computer, telecommunications and other types of electronic equipment.

A retractable door apparatus may include a (first and second) horizontally movable door frame member 112A, 112B, respectively, which may be useful in containing a flexible door material, coiled around a spool within each door frame member 112A, 112B, according to embodiments. Door frame members 112A, 112B may be moved horizontally, across the face of the open side of the electronic equipment rack assembly 100, while remaining engaged with, and guided by, (first) channel 104 and a (second) channel 106. Channels 104 and 106 may also be useful in keeping door frame members 112A, 112B in a vertical orientation. As door frame members 112A, 112B are horizontally separated from each other, door material may be unrolled from spools within the door frame members 112A, 112B, and may cover one or more partition 102 openings. A spring, operably coupled to the spool and to the interior of each of the door frame members 112A, 112B may provide a torsional tensioning force on the door material, causing it to remain taut.

The retractable door apparatus may include a plurality of latch plates 108, each having a receptacle, and mounted to the electronic equipment rack assembly 100. Latch plates 108 may be attached to a partition of the electronic equipment rack assembly through the use of fasteners such as screws, bolts or rivets, or friction fit into a receptacle within the partition.

In embodiments, each door frame member 112A, 112B may include a latching door handle, slidably attached to the door frame members 112A, 112B, and configured to engage with a latch plate of the plurality of latch plates attached to the rack assembly 100. A latching door handle of a door frame member (112A, 112B) may engage with a latch plate 108, and may be used to secure a door frame member 112A, 112B in a fixed position. Door frame members 112A, 112B may be positioned in any of a number of locations across the open side of rack assembly 100, and may be useful to allow opening and closing of racks 102 from either side of the rack assembly 100, according to embodiments.

The retractable door apparatus may be attached to electronic equipment rack assembly 100 by a (first and second) horizontally mounted channel (104, 106 respectively), attached to the top and bottom, respectively of an open side of the rack assembly 100, according to embodiments. The channels 104, 106 may be attached to the rack assembly 100 by screws, bolts and nuts, rivets, or other type of fastener.

Figure 2:
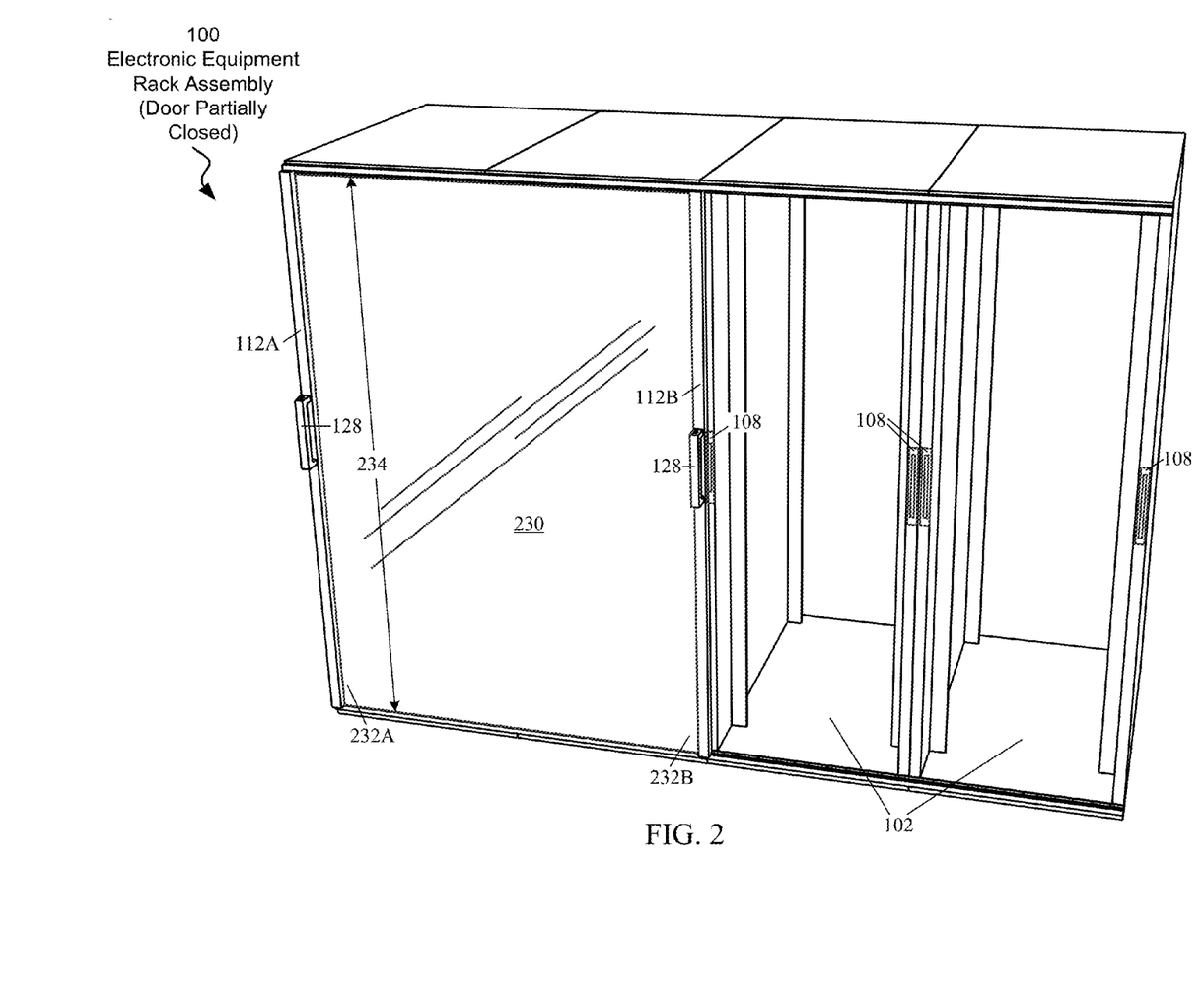
FIG. 2 is an isometric drawing of an electronic equipment rack assembly, including a retractable door apparatus covering open sides of adjacent rack assembly partitions, according to embodiments.

FIG. 2 is an isometric drawing of an electronic equipment rack assembly 100, consistent with FIG. 1, including a retractable door apparatus providing coverage, by a door material 230, for certain open sides of adjacent rack assembly 100 partitions 102, according to embodiments. Door frame member 112B may be positioned to the right of the door frame member 112A, resulting in door material 230 being extended to cover open sides of two partitions 102 of rack assembly 100. Latching door handles 128 may be engaged with corresponding latch plates 108, which may cause door frame members 112A, 112B to remain in secured positions relative to electronic equipment rack 100. The configuration depicted in FIG. 2 may be useful when access to a particular set of partitions 102 may be required, while other partitions 102 are required to be covered and/or secured.

The height 234 and width of door covering material 230 may be specified for a particular application. For example a particular retractable door apparatus may be designed with door covering material that may be wide enough to cover open sides of a specified number of racks 102, e.g., 4, according to embodiments. In certain embodiments, the height 234 of the door covering material 230 may be specified to be sufficient to cover, (from the top to the bottom of the open side), the open side of a particular electronic equipment rack assembly 100 having a particular height, for example, 72 inches.

Door material 230 may have a first lateral side 232A attached to the spool within a first door frame member 112A, and a second lateral side 232B attached to the spool of a second door frame member 112B. Door material 230 may include but not be limited to materials such as flexible metallic material, translucent plastic, plastic screen, metal screen, nylon, vinyl and Mylar. In certain embodiments, door material 230 may include more than one material type.

Particular types of door materials may have a certain properties which may be useful in particular applications. For example, plastic or metal screen, or other door material having perforations, may be useful for allowing cooling air to flow through the electronic equipment rack assembly 100, according to embodiments. Metal screen, or perforated metal material, may be useful in controlling electromagnetic interference (EMI) from being emitted from electronic equipment rack assembly 100. Door material 230 may also have fire-resistant properties.

Figure 3:
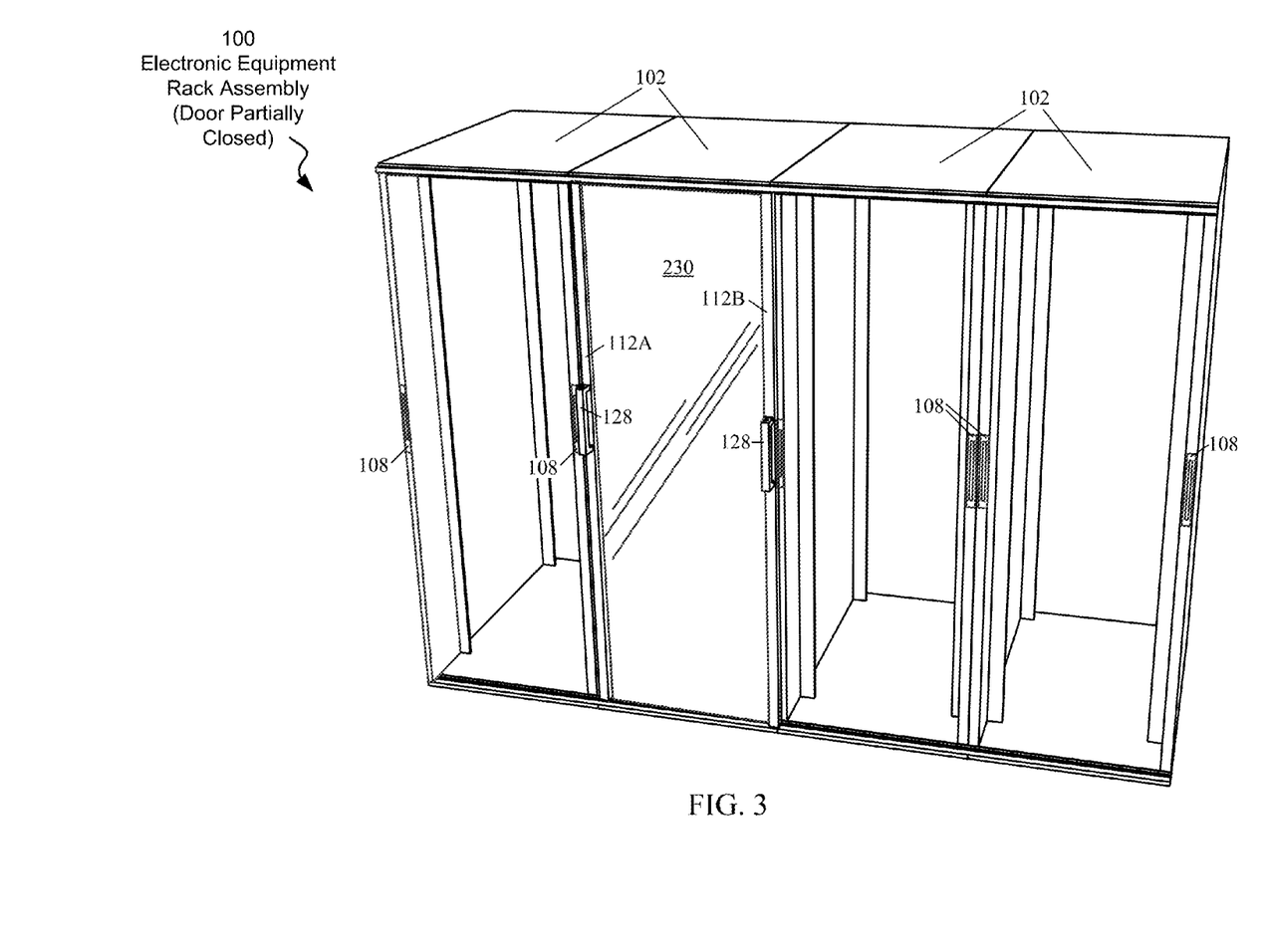
FIG. 3 is an isometric drawing of an electronic equipment rack assembly, including a retractable door apparatus covering an open side of a rack assembly partition, according to embodiments.

FIG. 3 is an isometric drawing of an electronic equipment rack assembly 100, consistent with FIG. 1, 2, including a retractable door apparatus providing coverage, by a door material 230, for an open side of a rack assembly 100 partition 102, according to embodiments. Door frame member 112B may be positioned to the right of the door frame member 112A, resulting in door material 230 being extended to cover an open side of a partition 102 of rack assembly 100. Latching door handles 128 may be engaged with corresponding latch plates 108, which may cause door frame members 112A, 112B to remain in secured positions relative to electronic equipment rack 100. The configuration depicted in FIG. 3 may be useful when access to a particular set of partitions 102 may be required, while a particular partition 102 may be required to be covered and/or secured.

Figure 4:
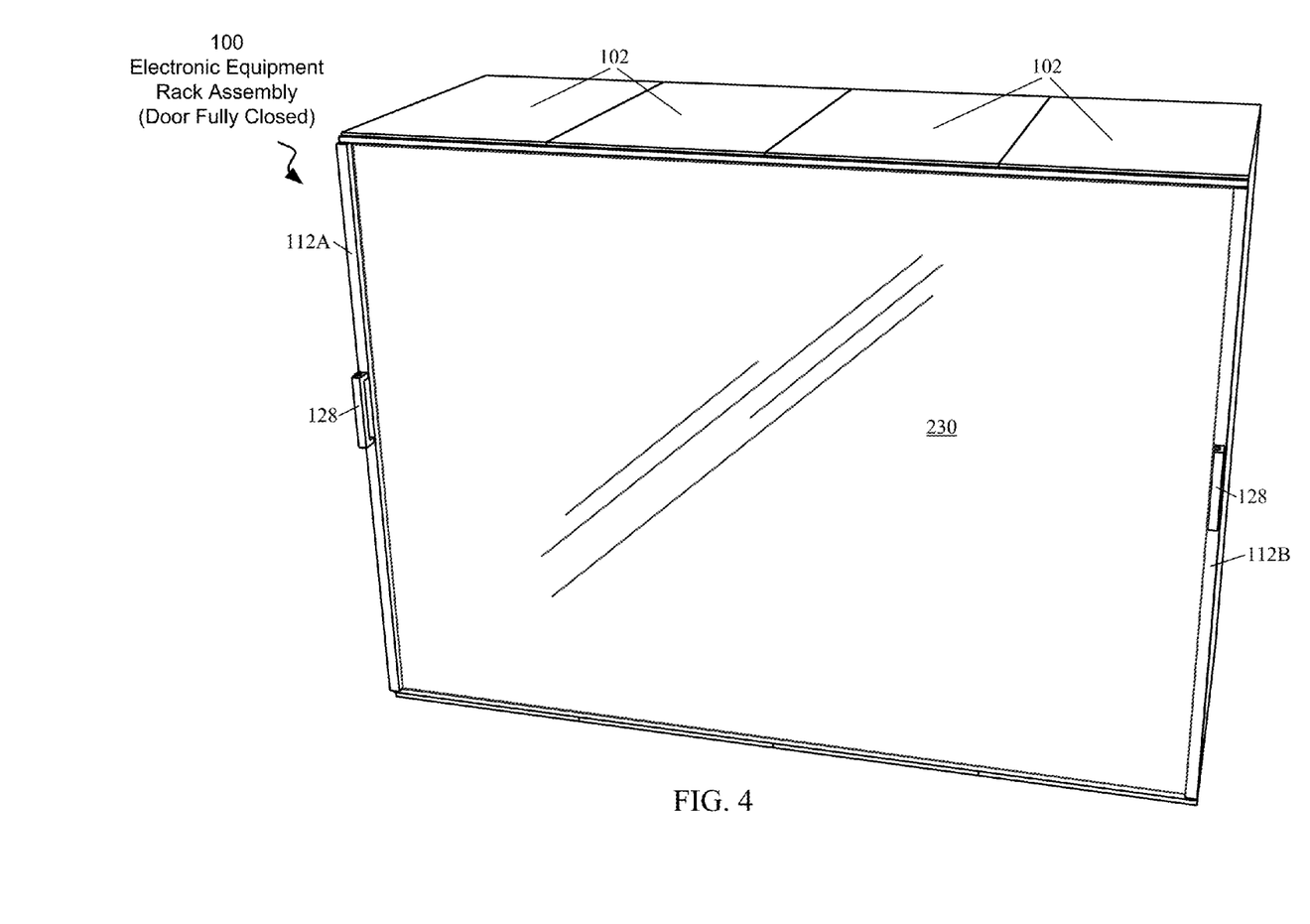
FIG. 4 is an isometric drawing of an electronic equipment rack assembly, including a retractable door apparatus covering open sides of all rack assembly partitions, according to embodiments.

FIG. 4 is an isometric drawing of an electronic equipment rack assembly 100, consistent with the figures, including a retractable door apparatus providing coverage, by a door material 230, for an open side of all rack assembly 100 partitions 102, according to embodiments. Door frame member 112B may be positioned to the right of the door frame member 112A, resulting in door material 230 being extended to cover an open side of all partitions 102 of rack assembly 100. Latching door handles 128 may be engaged with corresponding latch plates 108 (FIG. 1, 2, 3), which may cause door frame members 112A, 112B to remain in secured positions relative to electronic equipment rack assembly 100. The configuration depicted in FIG. 4 may be useful when all partitions 102 of rack assembly 100 are required to be covered and/or secured.

Figure 5:
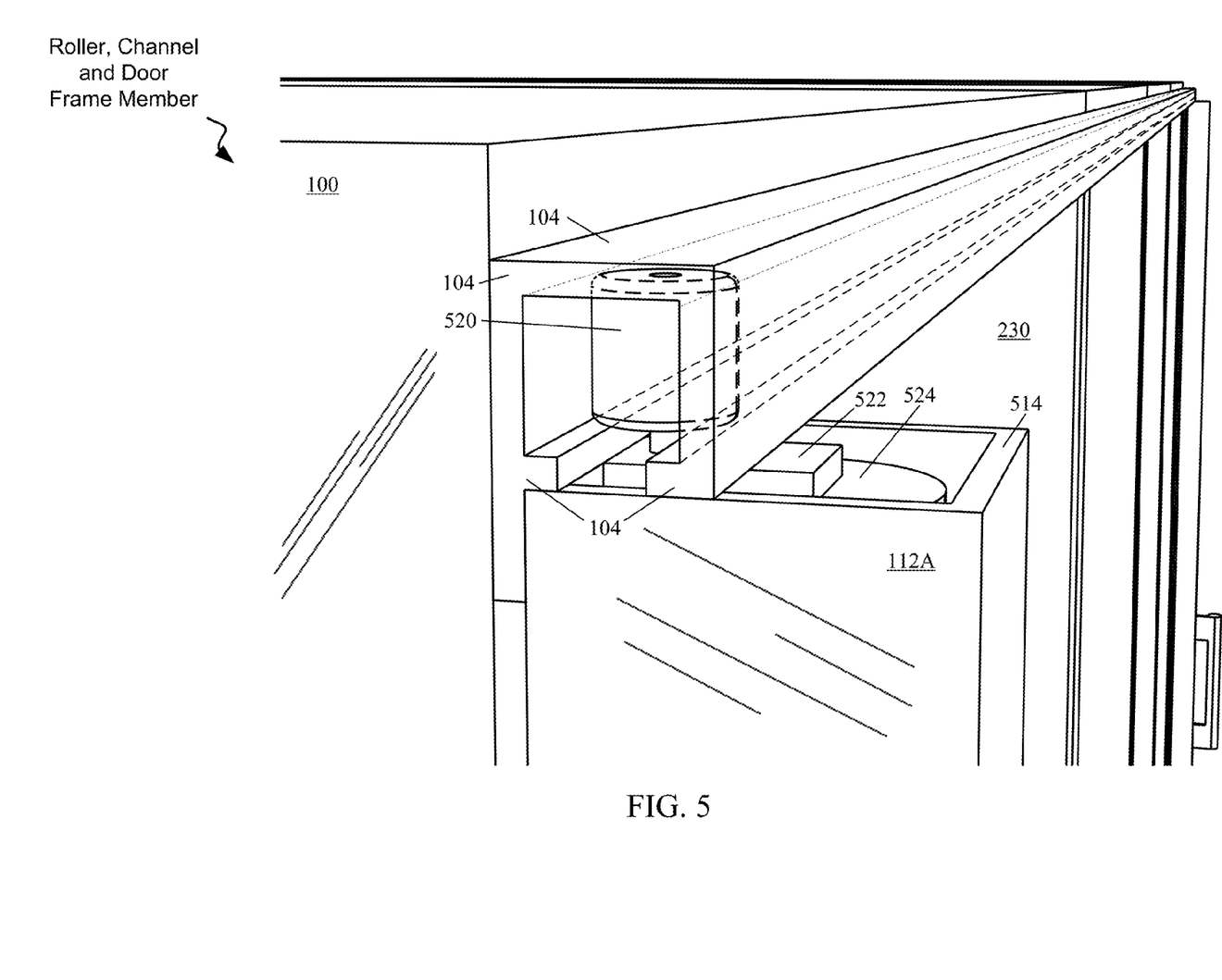
FIG. 5 is an isometric drawing of a movable door frame member engaged with a channel attached to an electronic equipment rack assembly, according to embodiments.

FIG. 5 is an isometric drawing, consistent with the figures, of a movable door frame member 112A engaged with a (first) channel 104 that may be attached to an electronic equipment rack assembly 100, according to embodiments. Movable door frame member 112A may include housing 514 including an upper location on the housing 522, and a spool 524, around which door material 230 may be coiled. Door frame member 112A may be useful for providing a movable container for, and mechanism for extending and retracting, door material 230, as door frame member 112A may be moved horizontally, relative to another door frame member (e.g., 112B, FIG. 1).

In embodiments, the door frame member 112A may have a slot that allows attachment of a latching door handle (128, FIG. 1). In embodiments, door frame member 112A may also have a slot that functions as an opening to an interior cavity of door frame member 112A, through which door material 230 may pass. Spool 524 may be contained within an interior cavity of housing 514, and may be attached to housing 514 at a lower end and an upper of spool 524.

A (first) roller 520 may be rotationally attached to the upper location of the housing 522, contained within the first channel 104 and be designed to maintain the door frame member 112A in a vertical orientation. Roller 520 may be useful for positioning, in conjunction with channel 104, movable door frame member 112A adjacent to electronic equipment assembly rack 100. Roller 520 may move within the length of channel 104, as the position of door frame member 112A is changed. Channel 104 may be also useful for maintaining door frame member 112A in a vertical orientation.

A second roller may be rotationally attached to a lower location of the housing, and contained within the second channel 106 (FIG. 1). The second roller, in conjunction with the first roller and channels 104, 106 (FIG. 1), may be designed to maintain the door frame member 112A in a vertical orientation. The (first) channel 104 may have a C-shaped cross-section with a downwards-facing opening to contain the first roller 520. The design of the C-shaped cross-section may cause the first roller 520 to be "captured" (not able to be removed from, except at a channel end) in channel 104. The (second) channel 106 (FIG. 1) may have a C-shaped cross-section similar to the cross-section of channel 104, and may have an upwards-facing opening to contain the second roller.

The first channel 104 and the second channel 106 may each include one or more detents designed to hold a door frame member 112A in a fixed position.

Figure 6:
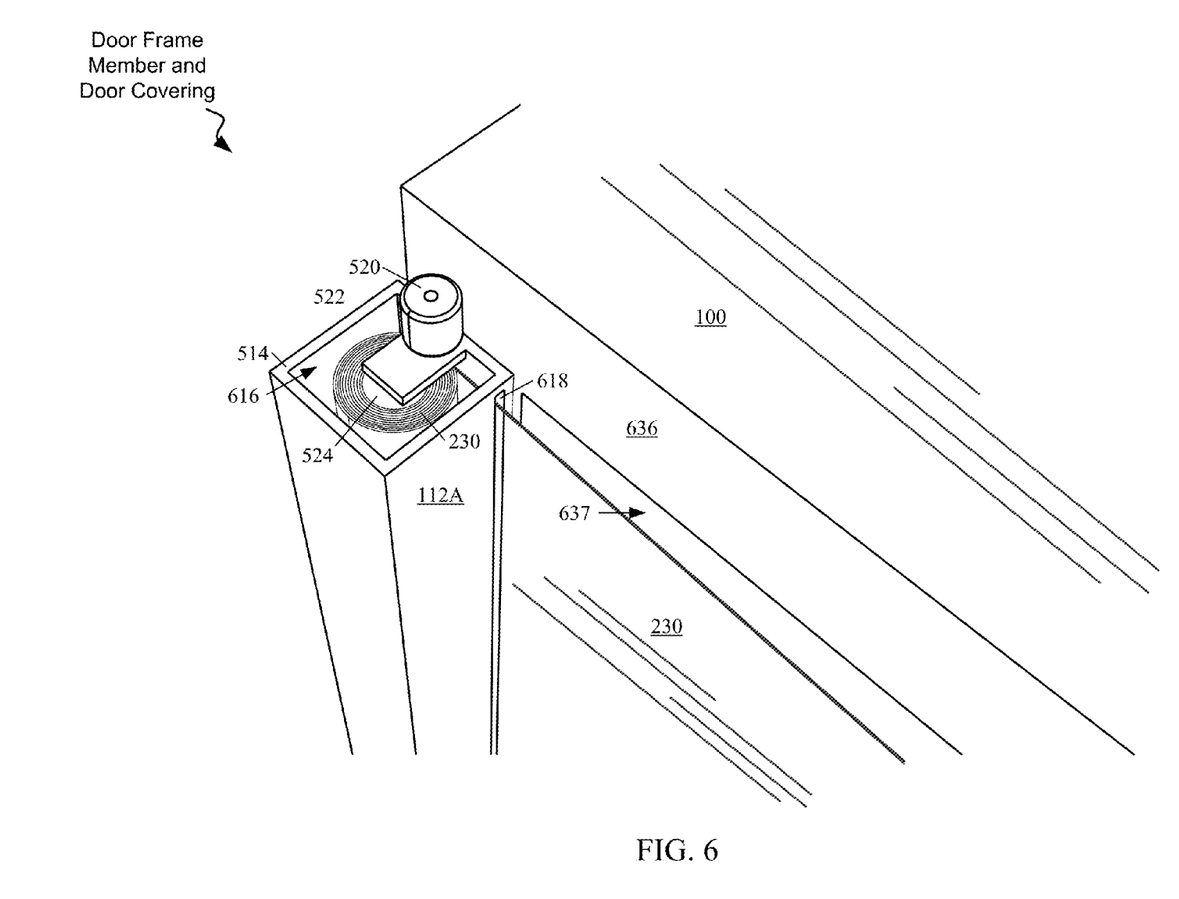
FIG. 6 is an isometric drawing (top view) of a movable door frame member and door material, positioned to cover an open side of an electronic equipment rack assembly, according to embodiments.

FIG. 6 is an isometric drawing (top view), consistent with FIG. 5, of a movable door frame member 112A and door material 230, positioned to cover an opening 637 in a side 636 of an electronic equipment rack assembly 100, according to embodiments. Movable door frame member 112A may include housing 514 having an upper location 522 on the housing 511, and a spool 524, around which door material 230 may be coiled. First roller 520 may be attached to the upper location 522. Slot 618 may allow a door material 230 to pass from the interior cavity 616 of the housing 514 to the exterior of the housing 514. Door material 230 is depicted covering opening 637 of electronic equipment rack assembly 100.

Door material 230 may have a first lateral side (232A, FIG. 2) attached to the spool of a first door frame member 112A, and a second lateral side (232B, FIG. 2) attached to the spool of a second door frame member and 112B (FIG. 1).

Figure 7:
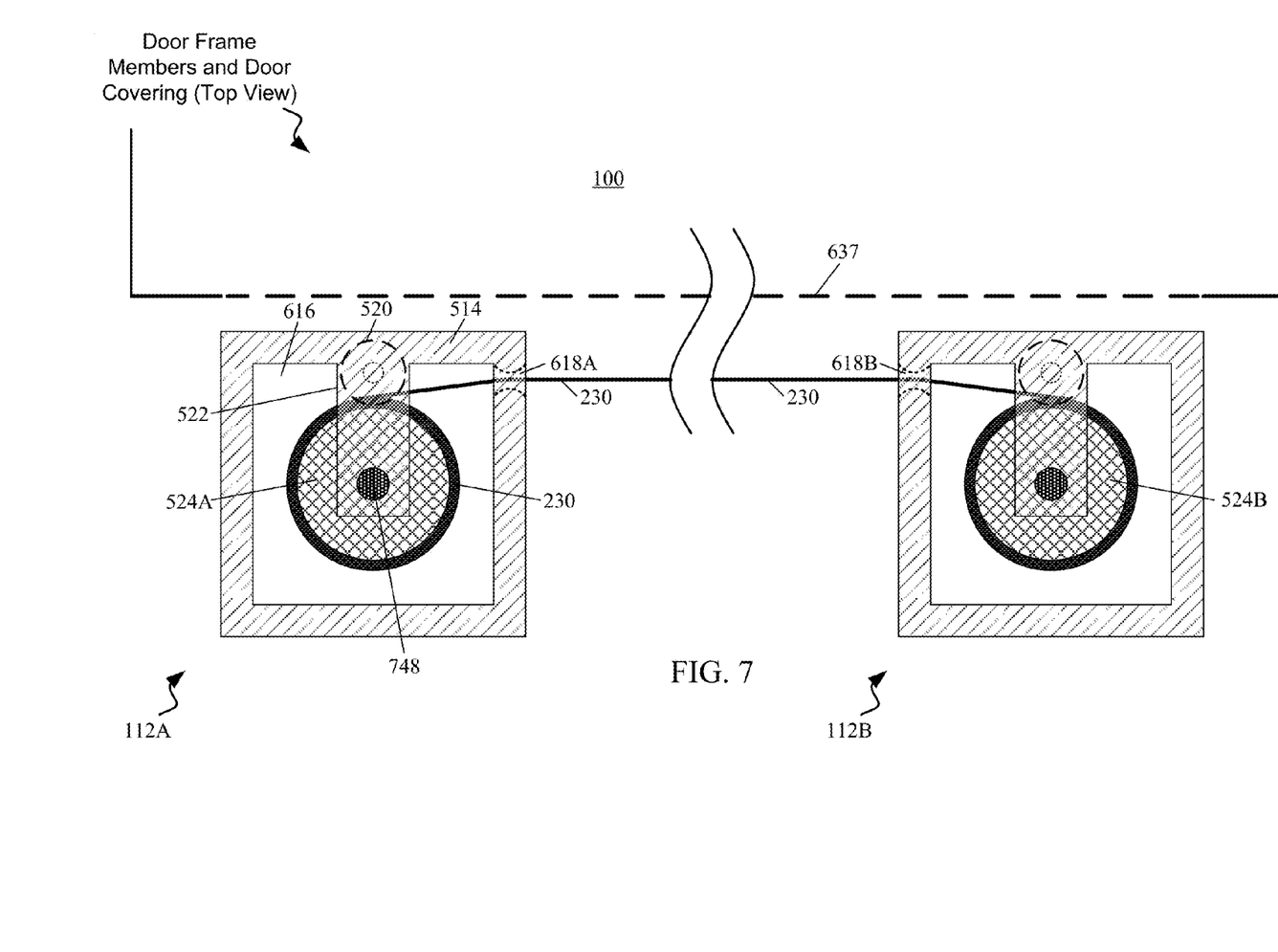
FIG. 7 is a top view of two movable door frame members and door material attached to and positioned between them, according to embodiments.

FIG. 7 is a top view, consistent with the figures, of two movable door frame members 112A, 112B, and door material 230 attached to and positioned between the door frame members 112A, 112B to cover an opening 637 of an electronic equipment rack assembly 100, according to embodiments. The configuration shown may be useful for illustrating the positioning of door material 230 in front of the opening 637 of an electronic equipment rack assembly 100, and the configuration door material 230 relative to door frame member 112A, 112B.

Door frame member 112A includes spool 524A attached to upper location 522 of housing 514 by upper pin 748, and located within cavity 616 of the housing 514. Door material 230 may be coiled around spools 524A, 524B and may pass through the slots 618A, 618B, which may have rounded edges, to smooth the movement and reduce wear of door material 230. Door frame member 112A may be guided and positioned by roller 520 within channel 104.

Door frame member 112B may be symmetrically consistent with door frame member 112A, having similar members and features. The slots 618A, 618B may be oriented to face each other, and allow a door material 230 to span a distance between them, corresponding to an opening 637 in rack assembly 100.

A retractable door apparatus kit may be useful in outfitting an existing electronic equipment rack assembly 100 with a retractable door apparatus. The retractable door apparatus kit may include two vertical door frame members 112A, 112B, a sheet of door material 230, (first and second) channels 104, 106, latch plates 108, and fasteners for use in attaching the channels 104, 106 and latch plates 108 to an electronic equipment rack assembly 100.

Figure 8:
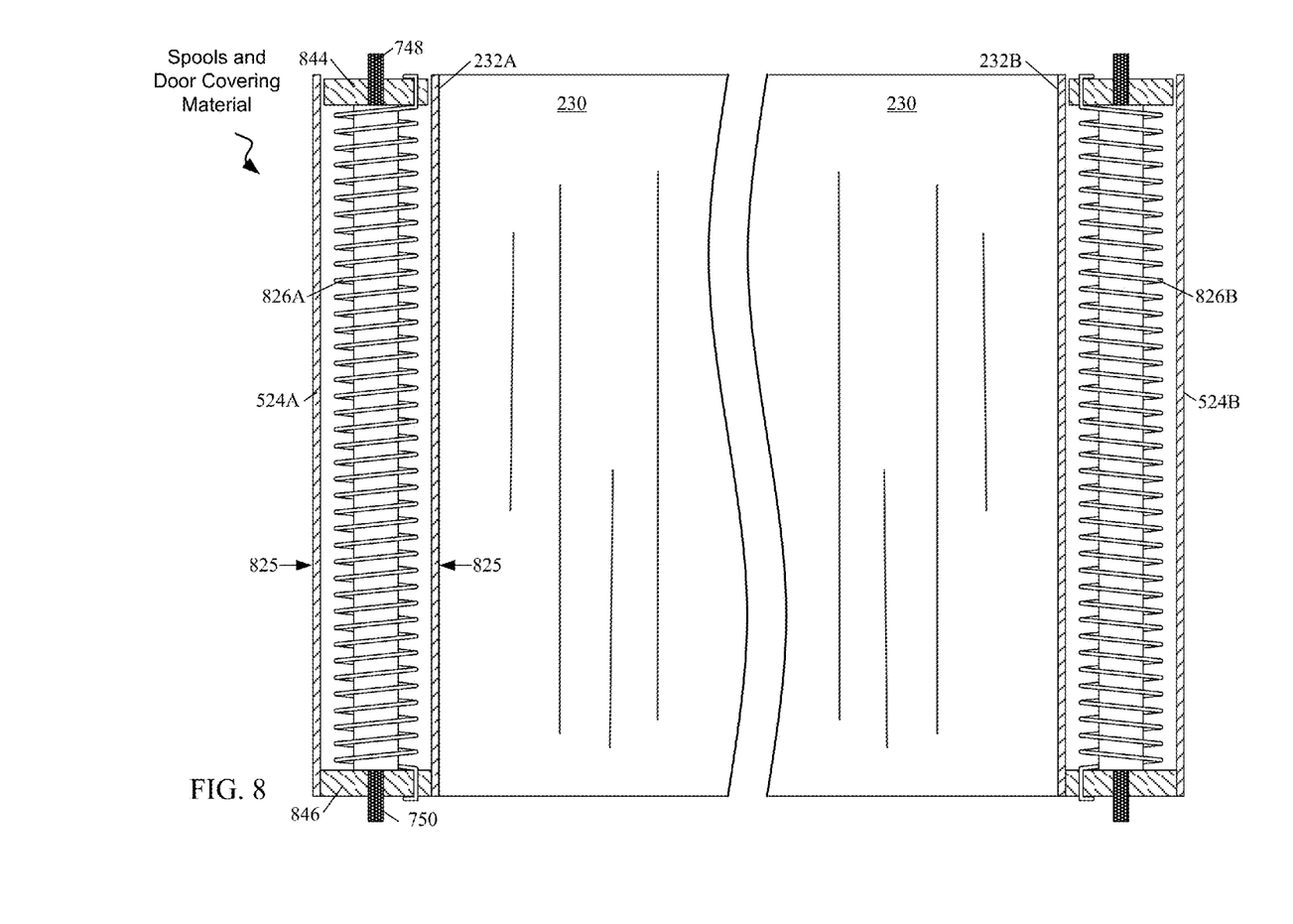
FIG. 8 is a cross-sectional side view of two spools, including retracting springs, and door material attached to and positioned between them, according to embodiments.

FIG. 8 is a cross-sectional side view, consistent with the figures, of two spools 524A, 524B, including retracting springs 826A, 826B, and door material 230 attached to and positioned between the spools 524A, 524B, according to embodiments. FIG. 8 may be useful for illustrating the interconnection and interaction of retracting springs 826A, 826B, spools 524A, 524B and door material 230.

Retracting springs 826A, 826B may be useful in providing torsional tensioning forces on the spools 524A, 524B. Torsional tensioning forces may cause door material 230 to be retracted and coiled onto the spools 524A, 524B when the spools 524A, 524B are moved towards each other, and may keep door material 230 taut when it is covering an opening 637 (FIG. 6) of a rack assembly (100, FIG. 6).

Spool 524A includes an outer cylindrical shell 825 and a spring 826A. A lower end of both the outer cylindrical shell 825 and the spring 826A are fixedly attached to a lower spool plate 846. Lower pin 750 may be attached to the lower spool plate 846, and may engage with, and rotate within, a hole in a lower location on a housing (similar to 522, FIG. 6).

Upper spool plate 844 may be fixedly attached to upper pin 748 and an upper end of spring 826A, and may be configured to allow outer cylindrical shell 825 to rotate around it. Upper pin 748 and upper spool plate 844 may be fixedly attached to an upper location 522 on the housing (522, FIG. 6) of a door frame member (112A, 112B, FIG. 1).

The fixed attachment of upper spool plate 844, upper pin 748 and the upper end of spring 826 to an upper location 522 on the housing (522, FIG. 6), in conjunction with the ability of the outer cylindrical shell 825, fixedly attached to the lower end of the spring 826 to freely rotate, may allow the spring 826 to exert a torsional tensioning force on the spool 524A.

For example, in the configuration described, the spool 524A may initially have no torsional force exerted upon it by the spring 826A. As the spool 524A is rotated, the spring may begin to exert a torsional force upon it. In embodiments, a lateral side (e.g., 232A, 232B) of the door material 230 may be attached to the outer cylindrical shell 825 of spool 524A, and a torsional tensioning force exerted by spring 826A may be used to both retract the door material 230, when the spools are moved towards each other, and to cause the door material 230 to remain taut when it is extended across an opening (e.g., 637, FIG. 6) of an electronic equipment rack assembly (100, FIG. 6).

In embodiments, spool 524B may behave in a manner similar to spool 524A, and may be configured to provide torsional tension in an opposite direction to the tension provided by spool 524A. The torsional tensioning force provided by the springs 826A, 826B may allow either spool 524A or 524B to retract or dispense door material 230.

Figure 9:
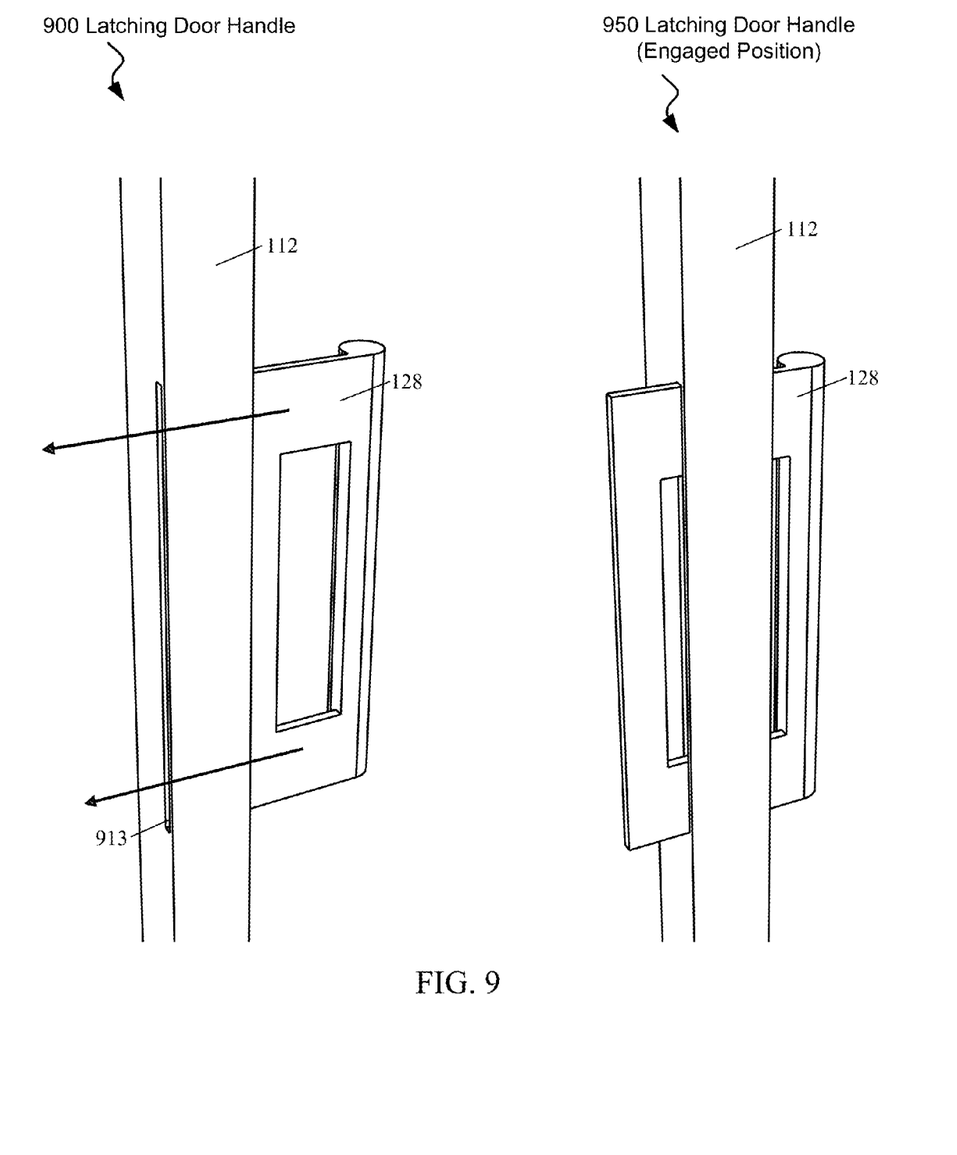
FIG. 9 depicts a latching door handle, configured to slide through a movable door frame member, according to embodiments.

FIG. 9 depicts a latching door handle 128, configured to slide through a movable door frame member 112, according to embodiments. View 900 depicts latching door handle 128 in a disengaged position. View 950 depicts latching door handle 128 in an engaged position.

A latching door handle 128 may have a cross-sectional shape that may be received by a recess in a latch plate (e.g., 108, FIG. 1) mounted to the rack assembly 100 (FIG. 1). The latching door handle 128, in conjunction with a latch plate 108 (FIG. 1) may be useful in securing a door frame member 112 in a fixed position relative to the rack assembly 100 (FIG. 1), and thus allowing door material 230 (FIG. 2) to be positioned in a desired location to cover openings of one or more racks 102 of the rack assembly 100 (FIG. 1).

Latching door handle 128 is depicted in FIG. 9 having a rectangular cross-sectional shape that may fit through slot 913 in door frame member 112, however in certain embodiments the latching door handle 128 may include a pin, and latch plates 108 (FIG. 1) may include a receptacle to receive the pin. Certain embodiments may include other latching door handle 128 shapes and types of latching mechanisms.

Figure 10:
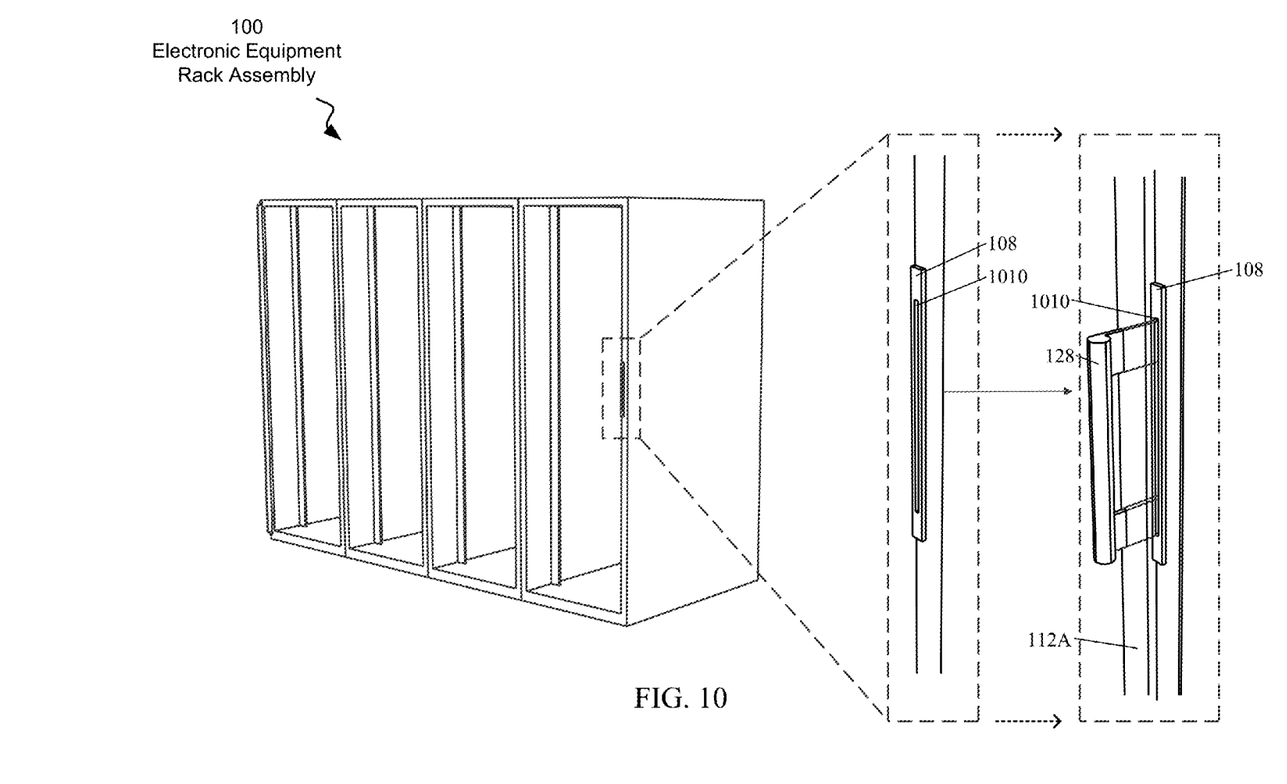
FIG. 10 depicts a latching door handle, configured to slide through a movable door frame member and engage with the receptacle of a latch plate, according to embodiments.

FIG. 10 depicts a latching door handle 128, configured to slide through a movable door frame member 112A and to engage with the receptacle 1010 of a latch plate 108, according to embodiments. In embodiments, a plurality of latch plates 108 may be attached to partitions of electronic equipment rack assembly 100, and latching door handle 128 may be designed to engage with any of them.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A retractable door apparatus for an electronic equipment rack assembly, comprising:
a first structure having a first channel that is horizontally mounted at a top of an open side of the rack assembly;
a second structure having a second channel that is horizontally mounted at a bottom of the open side of the rack assembly;
a first latch plate and a second latch plate, each having a receptacle and mounted to the electronic equipment rack assembly;
a first and a second horizontally movable door frame member, each having:
a housing with an interior cavity and a slot defining an opening to the interior cavity;

a first roller, rotationally attached to an upper location of the housing, contained within the first channel and designed to maintain the door frame member in a vertical orientation;

a second roller, rotationally attached to a lower location of the housing, contained within the second channel and designed to maintain the door frame member in a vertical orientation;

a spool, rotationally attached to the housing and positioned within the interior cavity of the housing;

a spring operably coupled to the spool and to the housing to provide a torsional tensioning force on the spool; and a latching door handle, slidably attached to the housing to engage, in a latched position, with the receptacle of one of the first latch plate and the second latch plate; and a door material having a first lateral side attached to the spool of a first door frame member and a second lateral side attached to the spool of a second door frame member, and configured to pass through a slot in the housing of the first door frame member and a slot in the housing of the second door frame member.

2. The retractable door apparatus of claim 1, wherein a height of the door material is sufficient to cover the open side of the rack assembly from the top of the open side of the rack assembly to the bottom of the open side of the rack assembly.

3. The retractable door apparatus of claim 1, wherein the slot in the housing of the first door frame member and the slot in the housing of the second door frame member are oriented to face each other.

4. The retractable door apparatus of claim 1, wherein the electronic equipment rack assembly includes a plurality of electronic equipment racks.

5. The retractable door apparatus of claim 1, further comprising a plurality of latch plates, each latch plate attached to a partition of the electronic equipment rack assembly.

6. The retractable door apparatus of claim 5, wherein the latching door handles of the first and of the second door frame members are configured to engage with each latch plate of the plurality of latch plates.

7. The retractable door apparatus of claim 1, wherein the door material includes perforations.

8. The retractable door apparatus of claim 1, wherein the door material has fire-resistant properties.

9. An electronic equipment rack assembly, comprising:
a plurality of electronic equipment enclosures, arranged adjacently, each enclosure having:
a first side surface and a second side surface opposite to the first side surface, the first and second side surfaces defining a cavity for housing an electronic component;
a first mounting rail adjacent to the first side surface, and a second mounting rail adjacent to the second side surface, the first and second mounting rails configured to support the electronic component;
an open side, facing a first direction;
a first retractable door apparatus, comprising:
a first structure having a first channel that is horizontally mounted at a top of an open side of the rack assembly;
a second structure having a second channel that is horizontally mounted at a bottom of the open side of the rack assembly;
a first latch plate and a second latch plate, each having a receptacle, and mounted to the rack assembly; and a first and a second horizontally movable door frame member, each having:
a housing with an interior cavity and a slot defining an opening to the interior cavity;
a first roller, rotationally attached to an upper location of the housing, contained within the first channel and designed to maintain the door frame member in a vertical orientation;
a second roller, rotationally attached to a lower location of the housing, contained within the second channel and designed to maintain the door frame member in a vertical orientation;
a spool, rotationally attached to the housing and positioned within the interior cavity of the housing;
a spring operably coupled to the spool and to the housing to provide a torsional tensioning force on the spool; and
a latching door handle, slidably attached to the housing to engage, in a latched position, with the receptacle of one of the first latch plate and the second latch plate; and
a door material having a first lateral side attached to the spool of a first door frame member and a second lateral side attached to the spool of a second door frame member, and configured to pass through a slot in the housing of the first door frame member and a slot in the housing of the second door frame member.

10. The electronic equipment rack assembly of claim 9, the first structure and the second structure each further comprising a detent to hold a door frame member in a fixed position.

11. The electronic equipment rack assembly of claim 9, wherein the latching door handle is operably connected to a pin, and the first and the second latch plate each include a recess defined to receive the pin.

12. The electronic equipment rack assembly of claim 9, wherein the first structure has a C-shaped cross-section with a downwards-facing opening to contain the first roller.

13. The electronic equipment rack assembly of claim 9, wherein the second structure has a C-shaped cross-section with an upwards-facing opening to contain the second roller.

14. A retractable door apparatus kit for an electronic equipment rack assembly, comprising:
a first structure having a first channel configured to be horizontally mounted at a top of an open side of the rack assembly;
a second structure having a second channel configured to be horizontally mounted at a bottom of the open side of the rack assembly;
a first latch plate and a second latch plate, each having a receptacle, and configured to be mounted to the rack assembly;
a first and a second horizontally movable door frame member, each having:
a housing with an interior cavity and a slot defining an opening to the interior cavity;
a first roller, configured to be rotationally attached to an upper location of the housing and contained within the first channel and designed to maintain the door frame member in a vertical orientation;
a second roller, configured to be rotationally attached to a lower location of the housing and contained within the second channel, and designed to maintain the door frame member in a vertical orientation;

a spool, configured to be rotationally attached to the housing and positioned within the interior cavity of the housing;

a spring configured to be operably coupled to the spool and to the housing to provide a torsional tensioning force on the spool; and a latching door handle, configured to be slidably attached to the housing to engage, in a latched position, with the receptacle of one of the first latch plate and the second latch plate; and a door material having a first lateral side configured to be attached to the spool of a first door frame member and a second lateral side configured to be attached to the spool of a second door frame member, and configured to pass through a slot in the housing of the first door frame member and a slot in the housing of the second door frame member.

15. The retractable door apparatus kit of claim 14, configured to provide coverage, by a door material, for an open side of a partition of the electronic equipment rack assembly.

16. The retractable door apparatus kit of claim 14, configured to provide coverage, by a door material, for open sides of a first section of adjacent partitions of the electronic equipment rack assembly.

17. The retractable door apparatus kit of claim 14, configured to provide coverage, by a door material, for open sides of all partitions of the electronic equipment rack assembly.

18. The retractable door apparatus kit of claim 14, wherein the door material includes at least one member of a group consisting of: flexible metallic material, translucent plastic, plastic screen, metal screen, nylon, vinyl and Mylar.

19. The retractable door apparatus kit of claim 14, further comprising fasteners to attach the first structure and the second structure to the open side of the rack assembly.

* * * * *